United States Patent [19]
Mathur

[11] Patent Number: 5,345,093
[45] Date of Patent: Sep. 6, 1994

[54] GRADED BANDGAP SEMICONDUCTOR DEVICE FOR REAL-TIME IMAGING

[75] Inventor: Veerendra K. Mathur, Beltsville, Md.

[73] Assignee: The United States of America as represented by the Secretary of the Navy, Washington, D.C.

[21] Appl. No.: 687,603

[22] Filed: Apr. 15, 1991

[51] Int. Cl.⁵ .................. H01L 31/12; H01L 31/16
[52] U.S. Cl. .................. 257/80; 257/185; 257/188; 257/442
[58] Field of Search .............. 357/19, 30 E, 30 L; 257/80, 184, 185, 188, 431, 442

[56] References Cited

U.S. PATENT DOCUMENTS

| | | | |
|---|---|---|---|
| 3,501,638 | 3/1970 | Compton et al. | 357/30 E |
| 3,891,993 | 6/1975 | Beneking | 357/30 E |
| 4,170,018 | 10/1979 | Runge | 357/17 |
| 4,383,269 | 5/1983 | Capasso | 357/30 E |
| 5,051,804 | 9/1991 | Morse et al. | 357/61 |
| 5,061,973 | 10/1991 | Chu | 357/16 |

FOREIGN PATENT DOCUMENTS

| | | | |
|---|---|---|---|
| 62-179163 | 8/1987 | Japan | 357/30 E |
| 2217106 | 10/1989 | United Kingdom | 357/30 E |

OTHER PUBLICATIONS

Lanza, C., et al. "Image Converter" IBM Tech. Disc. Bull. vol. 12, No. 11, Apr. 1970, pp. 1870–1871.

Primary Examiner—Sara W. Crane
Attorney, Agent, or Firm—Jacob Shuster

[57] ABSTRACT

Spectral shift between different wavelength spectra by restricted narrow bandgap absorption of incident radiation at one location on a semiconductor body, under electrical bias causing release of radiation at another emission location as a result of radiative electron-hole recombination. The semiconductor body is a graded bandgap establishing composition of two selected compounds alloyed to a variable, position-dependent degree between the respective radiation and emission locations at which the respective narrow and wide bandgap properties of the compounds prevail.

8 Claims, 1 Drawing Sheet

GRADED BANDGAP SEMICONDUCTOR DEVICE FOR REAL-TIME IMAGING

BACKGROUND OF THE INVENTION

This invention relates to real-time imaging of infrared signals utilizing semiconductor materials.

The detection of radiation limited to infrared wavelengths in a region of interest, such as 3 to 5μm emitted from relatively hot bodies and 8μm to 12μm emitted from bodies at ambient temperatures, by use of a narrow band gap semiconductor, is generally well known. Visible imaging of signals associated with such detected infrared radiation, however, has heretofore involved a considerable amount of electronic processing.

The conversion of infrared radiation into visible imaging light is disclosed, for example, in U.S. Pat. No. 4,914,296 to Reinhold et al. U.S. Pat. No. 4,157,926 to Schoolar relates, on the other hand, to the use of thin film semiconductor crystalline material for detection of infrared radiation. The design and selection of semiconductor materials for detection of radiation at infrared wavelengths is disclosed, by way of example, in U.S. Pat. Nos. 4,195,226, 4,691,107 and 4,885,620 to Robbins et al., Elliot et al., and Kemmer et al.

Methods and apparatus are also generally known in the art for the synthesis of semiconductors with desired characteristics. Such prior art apparatus include molecular beam epitaxy and vapor phase epitaxy devices enabling the growth of high quality semiconductor films and tandem positive ion accelerators by means of which the semiconductor film may be implanted with ions to obtain the desired electronic properties relating, for example, to electron mobility, carrier lifetime and band-gap gradient.

It is therefore an important object of the present invention to provide for more direct, portable and less costly real-time imaging of detected infrared radiation signals by upconversion to visible radiation involving spectral shift in wavelength of visible radiation.

SUMMARY OF THE INVENTION

In accordance with the present invention, radiation is detected and absorbed within a body of semiconductor material having position dependent concentrations of compounds alloyed to form a graded bandgap between radiation absorbing and emitting locations to convert incident radiation within the infrared spectrum into radiation released within a substantially different wavelength region, such as the visible spectrum, for signal imaging purposes. A body of the semiconductor material such as a thin film crystalline layer is synthesized from a judicious selection of the alloyed compounds having in common elements from a group consisting of tellurium, selenium and sulphur to exhibit a relatively narrow bandgap at the radiation absorbing location for restrictively accommodating photon absorption of the infrared incident radiation as well as to enable radiative electron-hole recombination under appropriate positive electrical bias for release of upconverted radiation at the emitting location where a wider bandgap prevails.

In certain embodiments, an infrared sensitive phosphor screen is coupled to the semiconductor body and responds to the upconverted radiation released at the emitting location to produce the visible wavelength radiation for signal target imaging purposes.

BRIEF DESCRIPTION OF THE DRAWING FIGURES

Other objects, advantages and novel features of the invention will become apparent from the following detailed description of the invention when considered in conjunction with the accompanying drawing wherein:

FIG. 1 is a schematic cross-sectional view of an infrared sensing semiconductor device in accordance with one embodiment of the invention; and FIG. 2 is an electron energy bandgap diagram graphically characterizing the electronic properties associated with the semiconductor device of FIG. 1.

DETAILED DESCRIPTION OF THE PREFERRED EMBODIMENT

Figure 1:
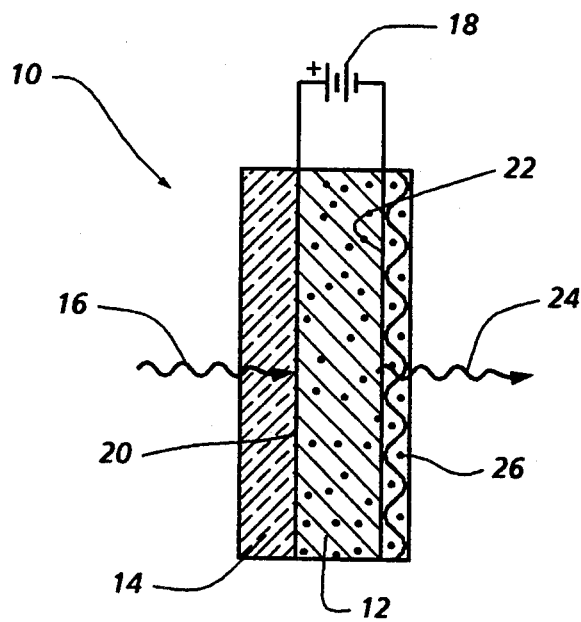

Referring now to the drawing in detail, FIG. 1 illustrates a semiconductor device, generally referred to by reference numerical 10, constructed in accordance with one embodiment of the invention. The device 10 comprises a semiconductor body 12 suitably supported on substrate 14 which is transparent for detection of infrared radiation, for example, by receiving incident radiation denoted by reference numeral 16. A suitable electrical bias is applied by voltage source 18 across the body 12 between surface locations 20 and 22 thereon to produce an upconverted emission 24 from location 22 at wavelengths smaller than those of the incident radiation 16 absorbed by the semiconductor body 12 at location 20. Thus, as shown in FIG. 1 the voltage source 18 applies a positive forward biasing potential to the body 12 at location 20. A phosphor screen 26 is coupled to the semiconductor body at location 22 as shown to emit visible radiation in response to emissions from location 22 at wavelength suitable for real-time signal target imaging purposes.

Absorption of incident radiation by the semiconductor body 12 is limited to infrared wavelengths within the region of interest by selection of a narrow bandgap material component from a group of mercury and lead compounds consisting of: HgTe, PbTe, PbSe and PbS. Such compounds respectively absorb radiation at peak response wavelengths of 40μ, 4μ, 3-4μ and 2-2.5μ to establish a narrow bandgap 28 at the incident absorption location 20 on semiconductor body 12, as denoted in FIG. 2. Such bandgap is furthermore established between conduction band edge 30 and valence band edge 32, characterizing properties resulting from the synthesis of the semiconductor body by selection of the aforementioned narrow bandgap material component alloyed with a bandgap opening group of cadmium compound components consisting of: CdTe, CdSe and CdS or any other compatible compounds having wider bandgaps 34. A crystalline semiconductor compound of Hg or Pb selected from the narrow bandgap group aforementioned may be produced by an expitaxial growth process and mixed with a compound of Cd from the aforementioned wide bandgap group by ion implantation in accordance with one embodiment of the invention to synthesize the graded bandgap semiconductor body 12 having a composition formed as a continuously varying position dependent alloy of the two selected semiconductor compound components. The composition of the semiconductor body is thus selected from a group consisting of: $Hg_{1-x}Cd_xTe$, $Pb_{1-x}Cd_xTe$, $Pb_{1-x}Cd_xSe$ and $Pb_{1-x}Cd_xS$, where x is position dependent degree of alloying varying between zero and one corresponding to continuous variation from the narrow bandgap 28 in one direction to the wider bandgap 34 as depicted in FIG. 2 in order to achieve the purposes of the invention.

It will become apparent from the foregoing description that the grading of the bandgap will depend on the selection of the narrow and wide bandgap compound components of the semiconductor body 12 as well as the position dependent degree of alloying X. Accordingly, at the incident radiation absorbing location 20, where x=0, the semiconductor composition (HgTe, PbTe, PbSe or PbS) corresponds to that of the narrow bandgap compound component. At the emission location 22 on the other hand, where x=1, the semiconductor composition (CdTe, CdSe or CdS) corresponds to that of the wide bandgap compound component.

Figure 2:
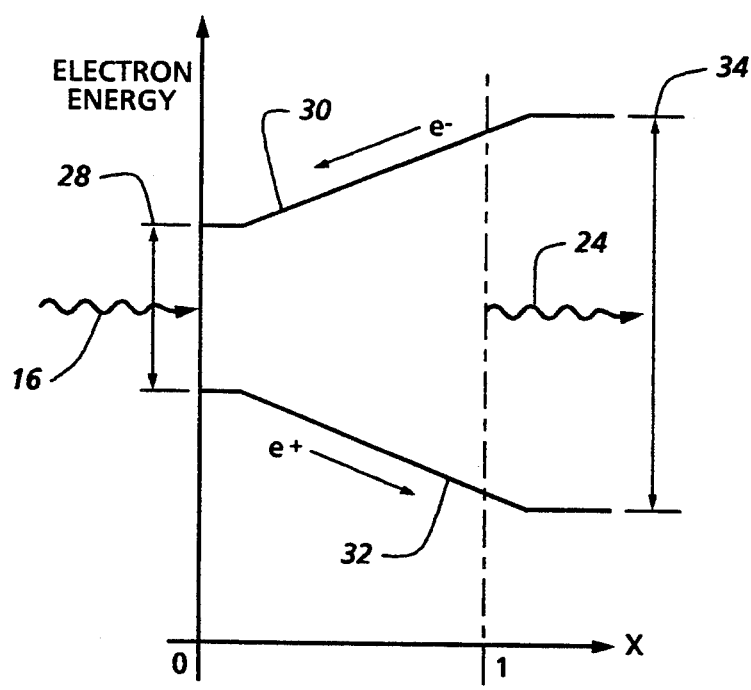

As shown in FIG. 1, the semiconductor body 12 at the narrow bandgap absorbing location 20 is biased positively with respect to the wide bandgap emitting location 22 by means of an electric field produced by voltage source 18 so that photon absorption at location 20 generates an electron-hole pair with electron drift along conduction band 30 in a direction toward the incident radiation or positive electrode location 20 as depicted in FIG. 2. The photogenerated electrons disappear at the positive electrode and reappear at the negative electrode location 22. At the same time, hole drift in the opposite direction occurs along valence band 32 at a slower rate resulting in radiative electron-hole recombination at the emission location 22 from which upconverted radiation is released The foregoing shift Δ(hv) in photon energy is presently known to be expressed as:

$$\Delta(hv) = F\mu\tau \frac{dEg}{dx},$$

where $\mu$ and $\tau$ are mobility and lifetime of the electron carriers, F is the intensity of the applied electric field and dEg/dx is the bandgap gradient Because of the foregoing relationship, generally known in the art, and the hereinbefore described synthesis of the semiconductor body 12, the desired operational aspects of the invention are realized. Where the alloy composition resulting from the selected compounds in the semiconductor body is: $Hg_{1-x}Cd_xTe$, for example, the corresponding operating parameters have been determined from the foregoing relationship as: $\mu = 6.3 \times 10^3$ cm$^2$ v$^{-1}$ s$^{-1}$, $\tau = 2.10^{-6}$S, dEg/dx=52eVcm$^{-1}$, F=1V/cm and Δ(hv)=0.65. Incident radiation 16 having a wavelength of 4μ, by way of example, would then be upconverted for a spectral shift to a wavelength of 1.2μ, readily detected by the infrared sensitive phosphor screen 26 associated with device 10.

A detector array of a plurality of devices 10 has the capability of providing real-time visible imaging with a resolution dependent on the incident surface distribution d density of such devices 10 in the detector array. Further, the device 10 as hereinbefore described may be modified in accordance with the present invention to act as an infrared radiation source by polarity reversal of the electric bias field applied to the body thereby downconverting visible radiation to infrared radiation emitted from location 20 at a desired frequency.

Numerous other modifications and variations of the present invention are possible in light of the foregoing teachings. It is therefore to be understood that within the scope of the appended claims the invention may be practiced otherwise than as specifically described.

I claim:

1. In a device having a graded bandgap semiconductor body with absorbing and emission locations thereon, said semiconductor body being formed from two semiconductor materials components alloyed with each other as a function of positional spacing between the radiation absorbing and emission locations for shift in wavelength of incident radiation at the absorbing location and electrical bias means connected to the semiconductor body at said absorbing and emission locations for applying a positive voltage potential to the absorbing location to effect said radiation wavelength shift in response to radiative electron-hole recombination, said two semiconductor material components having different bandgaps respectively established at the radiation absorbing and emission locations on the semiconductor body, one of the different bandgaps established at the radiation absorbing location being relatively narrow to limit absorption thereat to the incident radiation within an infrared wavelength region, the radiation emitted from the emission location embodying imaging energy and phosphor means coupled to the semiconductor body at the emission location for producing visible imaging radiation in response to the radiation emitted from the emission location.

2. In a graded bandgap semiconductor device for converting radiation between different wavelength regions, a body of semiconductor material extending between radiation absorbing and emitting locations, said semiconductor material being made of two different compounds respectively exhibiting relatively narrow and wide bandgaps at said locations, said compounds being alloyed with each other to a variable degree between said locations to form a varying composition expressed as: $A_{1-x}B_xC$, where x is the variable degree of alloying to substantially establish said two different compounds as AC and BC respectively, at the absorbing and emitting locations on the semiconductor body, A being an element of compound AC selected from a group consisting of mercury and lead, B being cadmium in the compound BC and C being an element in both of said compounds selected from a group consisting of tellurium, selenium and sulphur, the body of semiconductor material being formed with a radiation incident surface at the absorbing location, electrical bias means applying a positive potential to the body of semiconductor material at the absorbing location for release of upconverted radiation at the emitting location in response to radiative electron-hole recombination and phosphor means responsive to the upconverted radiation released for imaging thereof in the visible radiation spectrum.

3. In a graded bandgap semiconductor device for converting radiation between different wavelength regions, a body of semiconductor material extending between radiation absorbing and emitting locations, said semiconductor material being made of two different compounds respectively exhibiting relatively narrow and wide bandgaps at said locations, said compounds being alloyed with each other to a variable degree between said locations, electrical bias means applying a positive voltage potential to the body of semiconductor material at said absorbing location for release of wavelength converted radiation at the emitting location in response to radiative electron-hole recombination and phosphor means responsive to the converted radiation released from the emitting location for imaging thereof in the visible radiation spectrum.

4. In a method of detecting and shifting radiation between different wavelength spectra, the steps of: selecting two semiconductor compounds having relatively narrow and wide bandgaps; synthesizing a semiconductor body from said two compounds to establish a graded bandgap; exposing the semiconductor body at one of said two locations to incident radiation within one of the different wavelength spectra; electrically biasing the semiconductor body to effect release of wavelength shifted radiation therefrom at the other of the two locations as a result of radiative electron-hole recombination; and exposing phosphor material to said radiation released from the other of the two locations on the semiconductor body to emit imaging radiation within the other of said different wavelength spectra.

5. The method of claim 4 wherein said different wavelength spectra respectively embody infrared and visible radiation regions.

6. The method of claim 5 wherein said alloying of the two compounds is position dependent in accordance with: $A_{1-x}B_xC$, where X varies between zero and one, AC being one of the two semiconductors compounds having the narrow bandgap and BC being the other of the two semiconductor compounds having the wide band gap.

7. The method of claim 4 wherein said alloying is position dependent in accordance with: $A_{1-x}B_xC$, where X varies between zero and one, AC is one of the two semiconductors compounds having the narrow bandgap and BC is the other of the two semiconductor compounds having the wide band gap.

8. The method of claim 7 wherein element A of the compound AC is selected from a group consisting of: Hg and Pb, the element B of the compound BC being Cd and the element C common to both of the compounds being selected from a group consisting of: Te, Se and S.

* * * * *